United States Patent
Berman (10) Patent No.: US 11,232,844 B2
(45) Date of Patent: Jan. 25, 2022

(54) MEMORY WITH ADAPTIVE SLOW-CELL DATA COMPRESSION

(71) Applicant: SAMSUNG ELECTRONICS CO., LTD., Suwon-si (KR)

(72) Inventor: Amit Berman, Binyamina (IL)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/882,031

(22) Filed: May 22, 2020

(65) Prior Publication Data

US 2021/0366559 A1 Nov. 25, 2021

(51) Int. Cl.
| | | |
|---|---|---|
| G11C 16/04 | (2006.01) | |
| G11C 16/32 | (2006.01) | |
| G11C 16/10 | (2006.01) | |
| G06F 17/16 | (2006.01) | |
| G11C 16/08 | (2006.01) | |
| G11C 16/26 | (2006.01) | |

(52) U.S. Cl.
CPC ............. *G11C 16/32* (2013.01); *G06F 17/16* (2013.01); *G11C 16/08* (2013.01); *G11C 16/10* (2013.01); *G11C 16/26* (2013.01)

(58) Field of Classification Search
CPC ......... G11C 16/32; G11C 17/16; G11C 16/08; G11C 16/10; G11C 16/26
See application file for complete search history.

(56) References Cited

U.S. PATENT DOCUMENTS

| | | | | |
|---|---|---|---|---|
| 7,796,424 B2* | 9/2010 | Happ | ................. | G11C 13/0004 365/163 |
| 8,472,245 B2* | 6/2013 | Kim | ................... | G11C 16/0483 365/185.03 |
| 2013/0003453 A1* | 1/2013 | Park | ...................... | G11C 16/10 365/185.2 |
| 2014/0037086 A1* | 2/2014 | Seol | ...................... | H04L 9/0869 380/44 |

\* cited by examiner

*Primary Examiner* — Pho M Luu
(74) *Attorney, Agent, or Firm* — F. Chau & Associates, LLC (57) ABSTRACT

An apparatus and method are provided for memory programming, including receiving a first write data unit including a plurality of data bits; programming by at least one pulse the plurality of data bits to the plurality of memory cells; determining if a number of cells successfully programmed by the at least one pulse is less than a threshold; and if the number of cells successfully programmed by the at least one pulse is less than the threshold, compressing a sparse vector of unsuccessfully programmed data bits, receiving another write data unit, concatenating the vector based on the other write data unit, and programming the concatenated vector to another plurality of memory cells.

20 Claims, 8 Drawing Sheets

| % written bits after Ks pulses | Ks (as a fraction of full #pulses k) | | | | |
|---|---|---|---|---|---|
| | 0.5 | 0.6 | 0.7 | 0.8 | 0.9 |
| 95.0% | 1.6 | 1.4 | 1.2 | 1.0 | 0.9 |
| 96.0% | 1.7 | 1.4 | 1.2 | 1.1 | 0.9 |
| 97.0% | 1.7 | 1.5 | 1.2 | 1.1 | 1.0 |
| 98.0% | 1.8 | 1.5 | 1.3 | 1.1 | 1.0 |
| 99.0% | 1.9 | 1.6 | 1.4 | 1.2 | 1.1 |
| 99.9% | 2.0 | 1.7 | 1.4 | 1.2 | 1.1 |

FIG. 8

MEMORY WITH ADAPTIVE SLOW-CELL DATA COMPRESSION

TECHNICAL FIELD

Embodiments of the present disclosure relate to memory devices, and more particularly relate to write operations in memory devices with adaptive slow-cell data compression.

DISCUSSION OF RELATED ART

Increased data production rates have stimulated a transition to high-performance memory systems. Large-scale analytic applications may use caching layers and massive parallelism in order to meet specified latency requirements, but not without increased hardware costs. Small-scale mobile technology applications utilize low-area components, which may restrict the achievable gains from caching, parallelism, multiple coordinate instructions and/or hierarchical memory structures, and may therefore benefit from single-die speed-up improvements. Thus, accelerating write speed within a flash memory die, chip, package or device may be beneficial.

SUMMARY

An exemplary embodiment method is provided for memory programming, including receiving a first write data unit including a plurality of data bits; programming by at least one pulse the plurality of data bits to a plurality of memory cells; determining if a number of cells successfully programmed by the at least one pulse is less than a threshold; and if the number of cells successfully programmed by the at least one pulse is less than the threshold, receiving another write data unit, compressing and concatenating a sparse vector of unsuccessfully programmed data bits of the first write data unit with at least one of the other write data unit or another sparse vector of unsuccessfully programmed data bits of the other write data unit, and programming the concatenated vector to another plurality of memory cells.

An exemplary embodiment memory device is provided, including a memory cell array; a data circuit configured to receive a first write data unit including a first plurality of data bits; a row decoder connected to the memory cell array and configured to select a first word-line connected to a first plurality of memory cells of the memory cell array; a page buffer connected to the data circuit and to the memory cell array and configured to program by at least one pulse the first plurality of data bits to the first plurality of memory cells; a counter configured to determine if a number of cells successfully programmed by the at least one pulse is less than a threshold; a slow-cell data compressor connected to the counter and configured to compress, if the number of cells successfully programmed by the at least one pulse is less than the threshold, a first sparse vector of unsuccessfully programmed data bits; and a control circuit connected to the slow-cell data compressor and to the page buffer, and configured to concatenate, if the number of cells successfully programmed by the at least one pulse is less than the threshold, the first sparse vector based on a second write data unit, and to write the concatenated vector to a second plurality of memory cells of the memory cell array connected to a second word-line different from the first word-line.

An exemplary embodiment program storage device is provided, including program steps for receiving a first write data unit including a plurality of data bits; selecting a first address line connected to a plurality of memory cells; programming by at least one pulse the plurality of data bits to the plurality of memory cells; determining if a number of cells successfully programmed by the at least one pulse is less than a threshold; and if the number of cells successfully programmed by the at least one pulse is less than the threshold, compressing a sparse vector of unsuccessfully programmed data bits, receiving another write data unit, concatenating the vector based on the other write data unit, selecting a second address line connected to another plurality of memory cells, and programming the concatenated vector to the other plurality of memory cells, wherein the first and second address lines are disposed on different levels of a three-dimensional memory.

BRIEF DESCRIPTION OF THE DRAWINGS

Aspects of the present inventive concept may become more apparent and better appreciated upon consideration of the following description of exemplary embodiments when taken in conjunction with the accompanying drawings, in which.

DETAILED DESCRIPTION

I. Introduction

This section is organized into subsections, including subsection I that introduces an exemplary embodiment of the inventive concept, subsection II that presents the notations used, subsection III that introduces the sustained write acceleration scheme in greater detail, subsection IV that analyzes optimized parameter settings for the algorithm given product specifications of general memory cell behavior and pulse write bandwidth, subsection V that presents gain analyses of sustained write speeds with various algorithmic parameters and program statistics, subsection VI that details implementation specifics and overhead, and subsection VII that offers remarks on potential applications thereof.

The present disclosure provides a method and apparatus for sustained write program throughput by adaptive data compression for low-bandwidth regions in memory devices. Preferred embodiments may accelerate memory write operations with adaptive slow-cell data compression. Exemplary embodiments may be directed towards NAND flash memory devices, but the inventive concept is not limited thereto.

Write operations in NAND flash memories include multiple word-line pulses and at least one subsequent read for data verification. The amount of data that is stored in each pulse is neither known in advance nor distributed equally. Typically, early pulses have low program bandwidth, which increases and reaches a maximal point and then decreases exponentially with later pulses to variably obstinate or slow cells.

Figure 1:
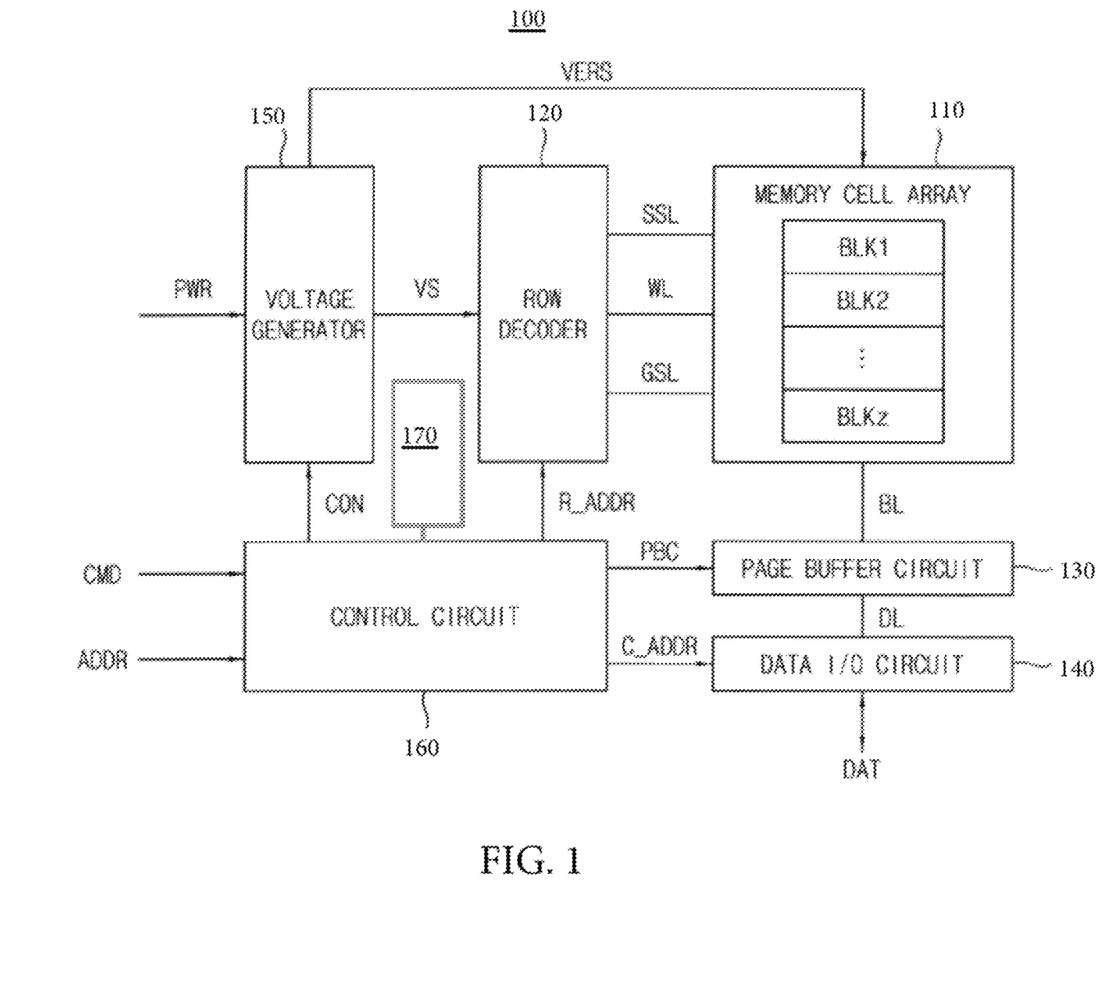
FIG. 1 is a schematic block diagram of a memory device in accordance with an exemplary embodiment of the present disclosure.

As shown in FIG. 1, an exemplary NAND flash memory device is indicated generally by the reference numeral 100. The NAND flash memory 100 includes a memory cell array 110, a row decoder 120 connected to the memory cell array, a page buffer circuit 130 connected to the memory cell array, a data input/output (I/O) circuit 140 connected to the page buffer circuit, a voltage generator 150 connected to the memory cell array, a control circuit 160 connected to the row decoder, page buffer circuit and voltage generator, and a slow-cell data compression unit 170 connected to the control circuit. The type of data compression performed by the slow-cell data compression unit 170 may include bit-packing and/or any other lossless data compression scheme suitable for use with binary-valued sparse vectors. Although the slow-cell data compression unit 170 is shown separately for illustrative purposes, it shall be understood that the slow-cell data compression unit 170 may be integral to the control circuit 160, the page buffer circuit 130, or the row decoder 120. The flash memory 100 includes a flash translation layer (FTL), which may be embodied in the control circuit 160.

The memory cell array 110 is connected to the row decoder 120 via a plurality of string selection lines SSL, a plurality of word-lines WL and a plurality of ground selection lines GSL. The memory cell array 110 is connected to the page buffer circuit 130 via a plurality of bit-lines BL. The memory cell array 110 may include a plurality of memory cells, such as, for example, a plurality of nonvolatile NAND flash memory cells, that are each connected to one of the plurality of word-lines WL and one of the plurality of bit-lines BL. The memory cell array 110 may be divided into a plurality of memory blocks, BLK1 through BLKz, each of which includes memory cells. In addition, each of the plurality of memory blocks, BLK1 through BLKz, may be divided into a plurality of pages.

The plurality of memory cells may be arranged in a two-dimensional (2D) array structure, or preferably in a three-dimensional (3D) vertical array structure. A 3D vertical array structure may include vertical cell strings that are vertically oriented such that at least one memory cell is located over another memory cell, which may be addressable in parallel. The at least one memory cell may comprise a charge trap layer. Suitable configurations for a memory cell array may include a 3D vertical array structure, in which the 3D memory array is configured as a plurality of levels, with bit-lines and/or word-lines shared between levels.

The control circuit 160 may receive an external command CMD and a logical address ADDR, such as from a host device and/or a storage controller, and controls erasure, programming and read operations of the nonvolatile memory 100 based on the command CMD and the logical address ADDR. An erasure operation may include performing a sequence of erase loops, and a program operation may include performing a sequence of program loops. Each program loop may include a write program operation, a write program verification operation, a slow cell compression operation, and a data concatenation operation. Each erase loop may include an erase operation and an erase verification operation. The read operations may include a normal read operation, a consolidated read operation, and data recovery read operation.

For example, the control circuit 160 may generate control signals CON, which are used for controlling the voltage generator 150, and may generate a control signal PBC for controlling the page buffer circuit 130, based on the command CMD, and may further generate a row address R_ADDR and a column address C_ADDR based on the logical address ADDR. The control circuit 160 may provide the row address R_ADDR to the row decoder 120 and may provide the column address C_ADDR to the data I/O circuit 140. The row decoder 120 may be connected to the memory cell array 110 via the plurality of string selection lines SSL, the plurality of word-lines WL and the plurality of ground selection lines GSL.

The voltage generator 150 may generate voltages VS for operation of the nonvolatile memory device 100 based on a power signal PWR and the control signals CON. The voltages VS may be applied to the plurality of string selection lines SSL, the plurality of word-lines WL and the plurality of ground selection lines GSL by the row decoder 120. In addition, the voltage generator 150 may generate an erase voltage VERS for the data erase operation based on the power signal PWR and the control signals CON. The erase voltage VERS may be applied to the memory cell array 110 directly or via the bit-lines BL.

The page buffer circuit 130 may be connected to the memory cell array 110 via the plurality of bit-lines BL. The page buffer circuit 130 may include a plurality of page buffers. In an exemplary embodiment, each page buffer may be connected to one bit-line. In alternate embodiments, each page buffer may be connected to two or more bit-lines.

The page buffer circuit 130 may store data DAT to be programmed into the memory cell array 110 via the bit-lines BL, or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT, generally from outside of the nonvolatile memory device 100 but including compressed and concatenated data, to the memory cell array 110 via data lines DL to the page buffer circuit 130, or may provide the data DAT from the memory cell array 110 to the page buffer circuit and/or the outside of the nonvolatile memory device 100, based on the column address C_ADDR.

Figure 2:
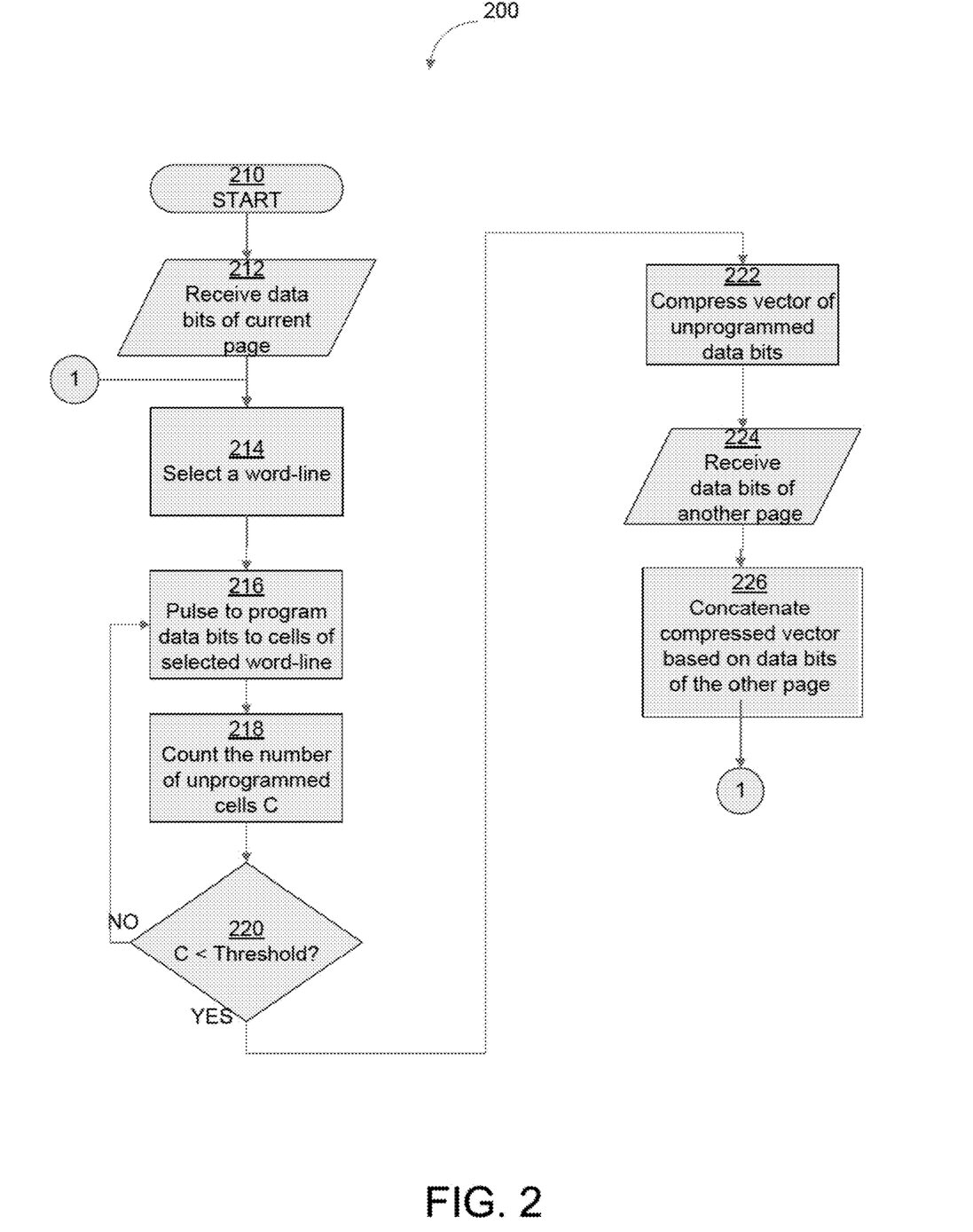
FIG. 2 is a schematic flow diagram of a method for writing data to the memory device of FIG. 1 in accordance with an exemplary embodiment of the present disclosure.

Turning to FIG. 2, an exemplary method for writing to memory is indicated generally by the reference numeral 200. The method initializes with a start block 210, which passes control to an input block 212 to receive data bits of the current page, which, in turn, passes control to a function block 214.

The function block 214 selects a new word-line, and passes control to a function block 216. The block 216 writes the data bits by pulsing the memory cells of the selected word-line to program the data bits to the cells of the selected word-line, and passes control to a function block 218. The block 218 counts the number of remaining unprogrammed cells, C, and passes control to a decision block 220. The block 220 determines whether the number of remaining unprogrammed cells, C, is less than a threshold, and if not, passes control back to the block 216.

When the block 220 determines that the number of remaining unprogrammed cells, C, is less than the threshold, it passes control to a function block 222. The block 222 compresses a vector of unprogrammed data bits that were originally intended for the unprogrammed cells, and passes control to an input block 224. The block 224 receives the data bits of another page, and passes control to a function block 226. The block 226, in turn, concatenates the compressed vector with the received data bits of the next page, and passes control back to block 214. Concatenation may be performed by inserting the compressed vector into the data buffer before the received data bits, but is not limited thereto. In an alternate embodiment, concatenation may be performed by inserting the compressed vector into the data buffer after the received data bits.

Thus, the exemplary algorithm for sustained write acceleration interrupts regular write program operation before its completion, compresses the remaining data that were not written, and programs the compressed remaining data in another word-line along with the next page of data.

The scheme exploits program pulses that have high bandwidth, and enables a sustained increase in program speed. Since a sector read may utilize reads of two word-lines, the compressed residual data is preferably stored in the NAND memory of a different plane or channel to facilitate parallel sensing. A logical-to-physical address distribution has been designed accordingly. Modeling and analysis results show significant improvements in sustained program bandwidth, depending on incremental step programming pulses (ISPP) and device parameters. In order to implement the algorithm, firmware modifications may be used at the memory controller. The benefits of the algorithm may increase in proportion to slow-cell device variations.

NAND flash memory may be programmed by a series of incremental step programming pulses, where a word-line read is carried out after each or multiple pulses for data verification and future pulse inhibition for cells that have already reached their target levels. The amount of data that is stored is different from one pulse to another. Hence, the temporary program pulse bandwidth varies during program operation, where a small number of cells are typically programmed with the first few pulses, then the bandwidth increases as a larger number of cells reach their destination levels, and then the write rate decreases as a few slow cells take additional program resources to complete the process with low bandwidth.

In order to exploit the differentiation between write phases, the write program may be activated through just the high-bandwidth region. An exemplary scheme is to activate regular program operation, and stop it when the amount of data stored per pulse drops below a predefined threshold. Then the remaining data that was not programmed is compressed, concatenated with next sector data, and written elsewhere based on the same method.

Figure 3:
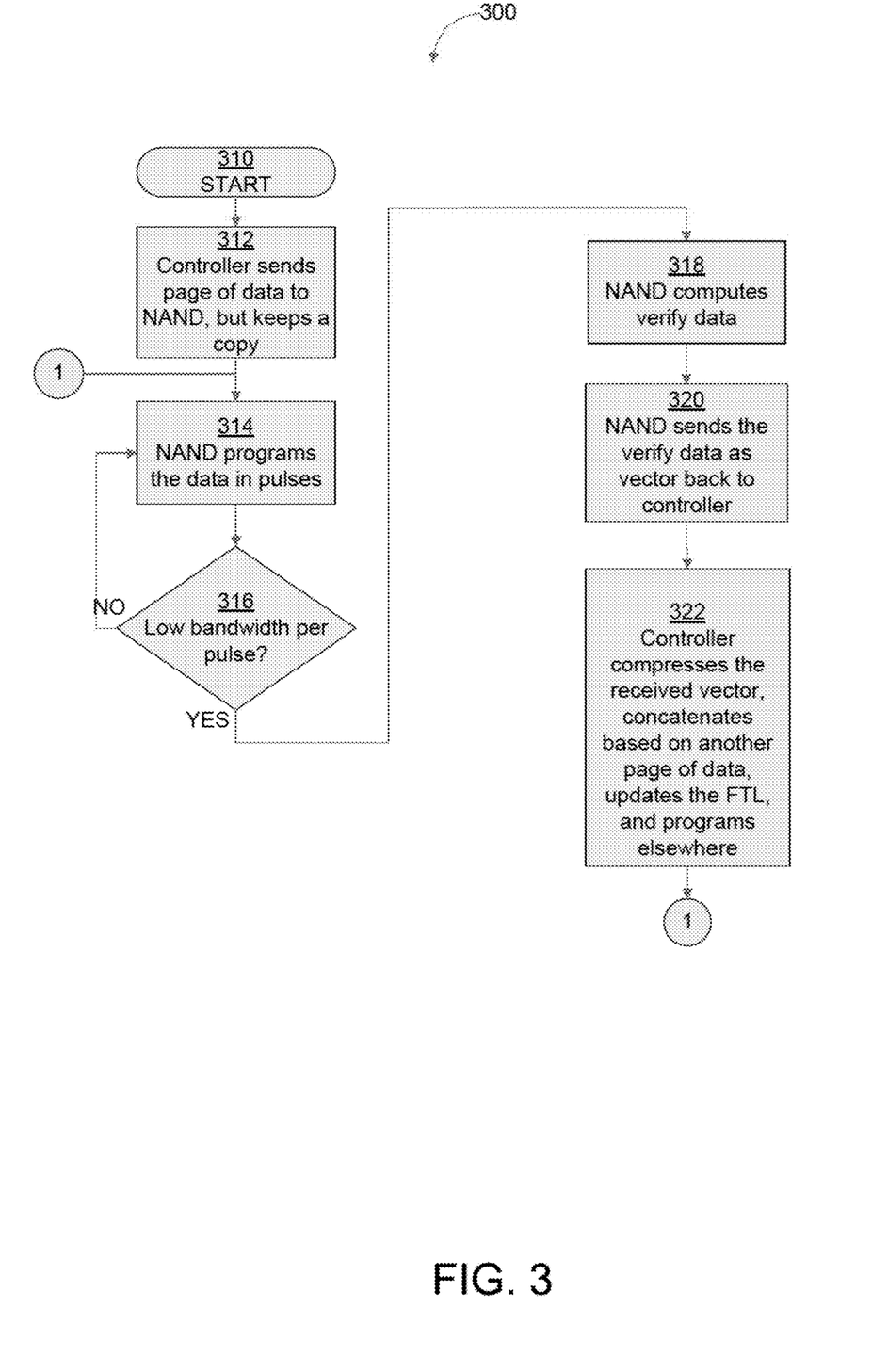
FIG. 3 is a schematic flow diagram of a method for writing data to a memory device with controller dominance in accordance with an exemplary embodiment of the present disclosure.

Turning now to FIG. 3, an exemplary method for writing to a memory with controller dominance is indicated generally by the reference numeral 300. The method initializes with a start block 310, which passes control to a function block 312, by which a controller sends a page of data to a memory, such as a NAND memory, but also saves a copy of the page of data in the controller. The block 312 passes control to a function block 314, by which the NAND memory programs the data in pulses, and passes control to a decision block 316. The block 316 determines whether there is low bandwidth per pulse, and if not, passes control back to block 314.

If the block 316 determines that there is low bandwidth per pulse, it passes control to function block 318. Block 318, in turn, uses the NAND to compute verify data, and passes control to a function block 320. The block 320 uses the NAND to send the verify data as a vector back to controller, and passes control to a function block 322. The block 322 causes the controller to compress the received vector, concatenate it with another page of data, update the flash translation layer (FTL), and program the concatenated data elsewhere.

Figure 4:
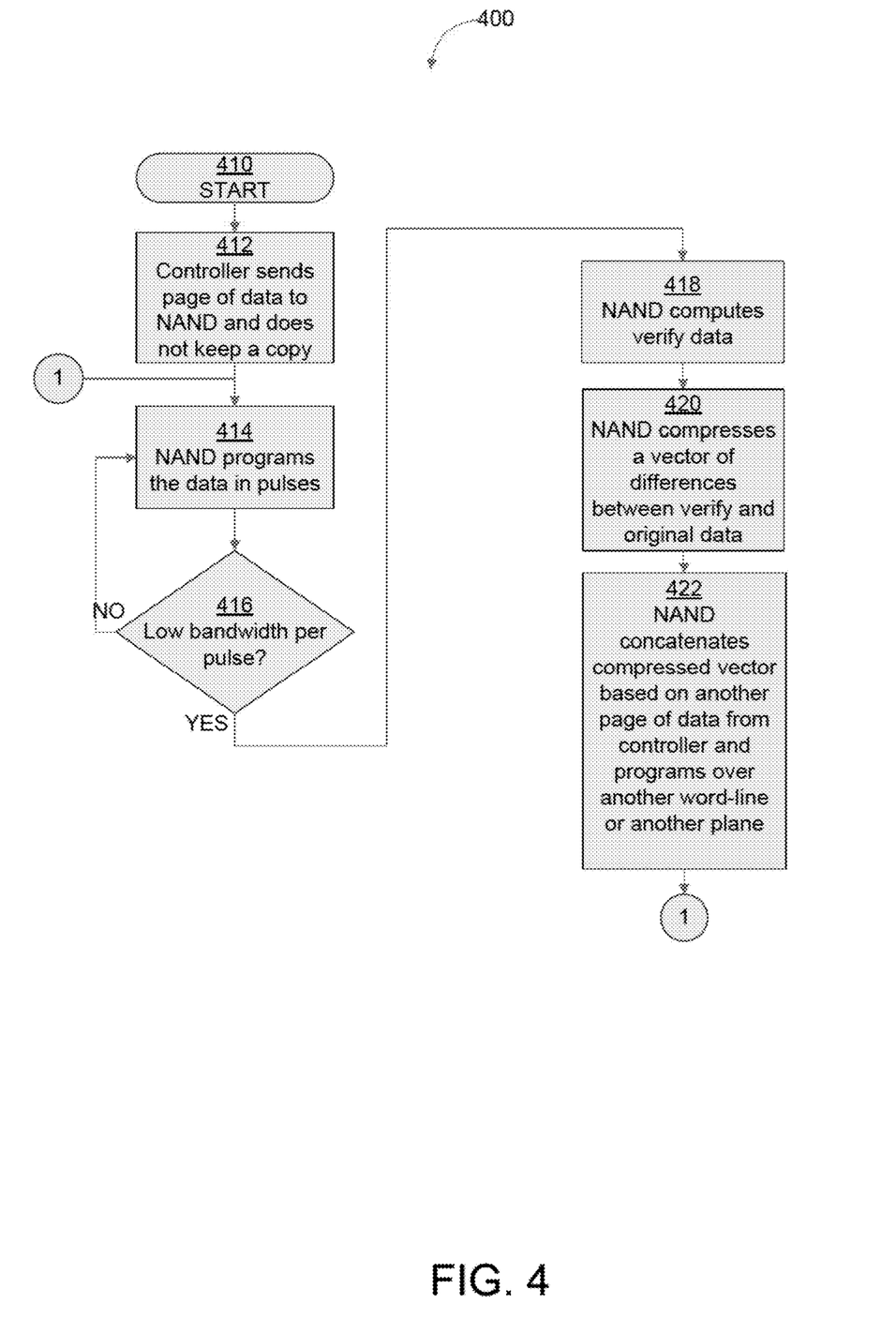
FIG. 4 is a schematic flow diagram of a method for writing data to a memory device with memory dominance in accordance with an exemplary embodiment of the present disclosure.

As shown in FIG. 4, an exemplary method for writing to a memory with memory dominance is indicated generally by the reference numeral 400. The method initializes with a start block 410, which passes control to a function block 412, by which a controller sends a page of data to a memory, such as a NAND memory, but does not save a copy. The block 412 passes control to a function block 414, by which the NAND memory programs the data in pulses, and passes control to a decision block 416. The block 416 determines whether there is low bandwidth per pulse, and if not, passes control back to block 414.

If the block 416 determines that there is low bandwidth per pulse, it passes control to function block 418. Block 418, in turn, uses the NAND to compute verify data, and passes control to a function block 420. The block 420 uses the NAND to compress a vector of differences between the verify data and the original data, and passes control to a function block 422. The block 422 causes the NAND to concatenate the compressed vector with another page of data from the controller, which the NAND programs over another word-line or another plane.

Figure 5:
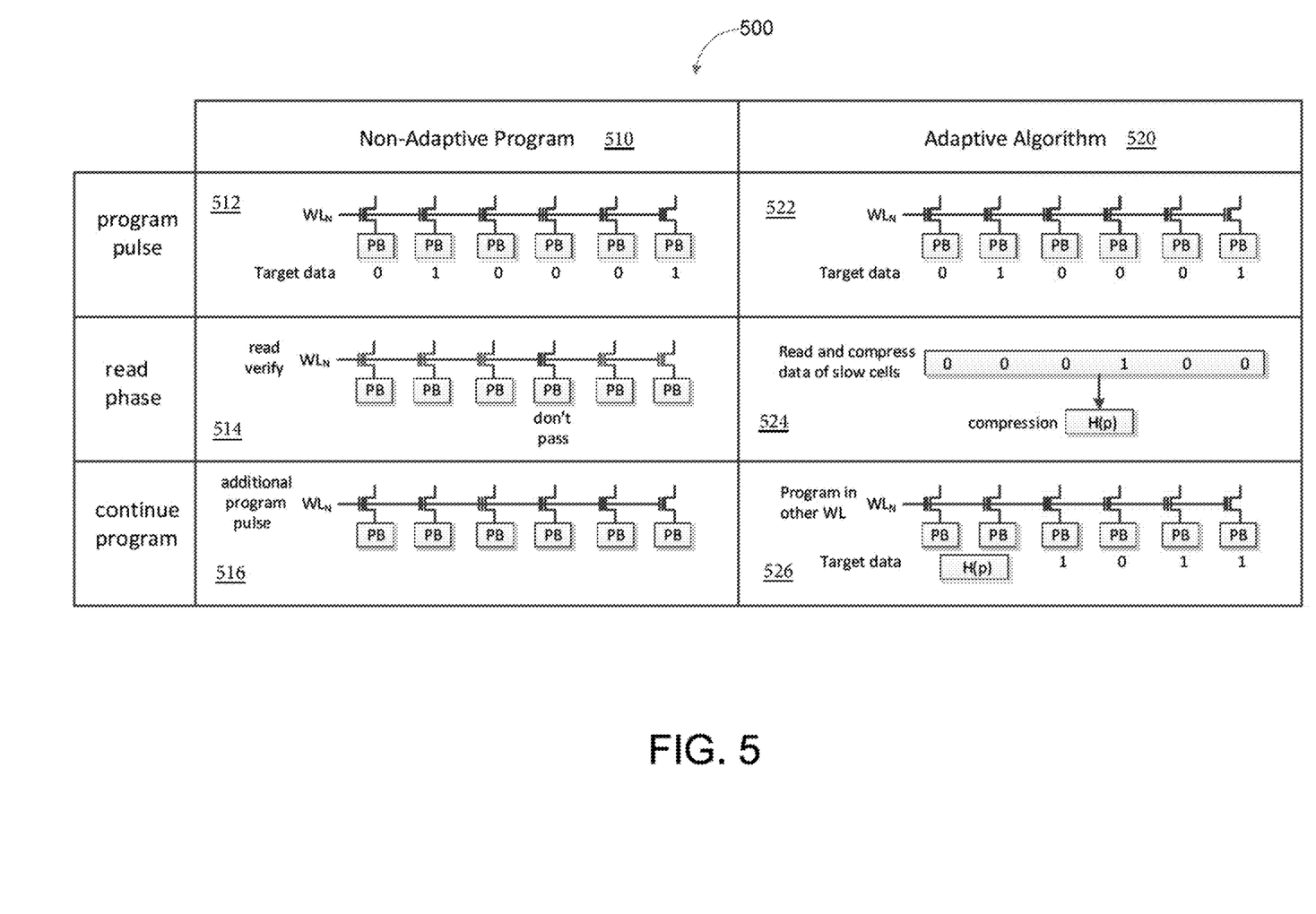
FIG. 5 is a hybrid partial-schematic diagram comparing non-adaptive program operation with the method of FIG. 2 in accordance with an exemplary embodiment of the present disclosure.

Turning now to FIG. 5, a comparison of an exemplary slow-cell-adaptive algorithm operation versus non-adaptive program operation is indicated generally by the reference numeral 500. Here, operation of a non-adaptive program 510 is shown on the left side of the comparative figure, and operation of an exemplary slow-cell-adaptive algorithm 520 is shown on the right side of the comparative figure.

In the non-adaptive program 510, the current state is shown towards the left. An example of a data vector (0,1,0,0,0,1) is being written. In the first or program pulse phase 512, the cells with 0's get a program pulse. Then, in the second or read phase 514, cells are read and examined to determine whether or not they occupy target data levels by means of a cell verify pass. In the figure, the fourth cell from the left is the only one that did not pass verification.

In the third or continue program phase 516, the non-adaptive program continues with applying program pulses for the cells that did not reach their target levels, hence continuing with the fourth cell. Generally, the number of addressed cells is reduced in each pulse and therefore the data volume that is written per pulse also decreases.

In the exemplary slow-cell adaptive algorithm 520, flow is depicted in the right column of the figure. Here, the first step 522 is similar to the first step 512 of the non-adaptive program process, so duplicate description is omitted. Next, in a read phase 524, a read is performed and outputs a sparse vector (0,0,0,1,0,0), where each 0 represents a cell that has reached its target level and each 1 represents a cell that has not reached its target level. The term "sparse vector" as used herein refers to a vector in which most of the elements are zero. The marked places are actually slow cells that were detected dynamically. In a third phase 526, the vector is then compressed and concatenated with other sparse vectors and/or another data sector, which is to be programmed on another word-line. In this way, every program pulse is used for a high number of cells and one may eliminate the scenario of applying additional pulses for a small number of cells. Therefore, write bandwidth increases.

That is, in this comparison of non-adaptive programming versus an exemplary slow-cell-adaptive algorithm for sustained write acceleration, the following distinctions may be made: In the left or non-adaptive program, a program pulse is applied to target cells, a word-line is read for verification purposes, the cells which need further program pulses are determined, and the next pulse is executed while returning to the beginning of the program loop.

In the right or adaptive scheme, program pulses are applied to the word-line until the number of un-programmed cells, whether total or per pulse, is lower than a predefined threshold. Then, the resulting vector of data that is assigned to slow cells is compressed, concatenated with other sector data, and is written to another word-line preferably in another plane. Write bandwidth increases because the program pulses program a larger number of cells using a smaller number of pulses.

In this exemplary embodiment, the compressed sparse vector of unsuccessfully programmed data bits may be concatenated with another write data unit or sector, such as but not limited to the next write data unit or sector. In an alternate embodiment, the adaptive write process may collect and concatenate multiple compressed sparse vectors of unsuccessfully programmed data bits, and write them together, such as once they span the size of a buffer, a write data unit, or a sector, for example. In yet another alternate embodiment, multiple sparse vectors may be concatenated and then compressed, such as to increase compression efficiency, and particularly if it is statistically likely that the bifurcated data will be reconsolidated prior to substantial data read operations taking place.

That is, the compressed sparse vectors of unsuccessfully programmed data bits need not be concatenated with the very next write data unit or sector to be programmed. The adaptive write process may continue to collect multiple sparse vectors and write them together in a single write data unit, for example. Moreover, various write schemes may be adapted according to the particular aggregation and distribution characteristics of the compressed sparse vectors, such as in different applications and/or environments, to meet desired performance criteria.

Supportive resources for the implementation of the described exemplary scheme are storage capacity, read time, and proper flash translation layer (FTL) management. The percentage of redundant cells which are skipped can be tuned by the exemplary algorithm to improve write performance with a trade-off in storage capacity. The read time is not affected in small instruction queues since programming of compressed data is performed in another plane or channel, and thus can be sensed in parallel. In large instruction queues, the channels bus would transmit an increased amount of data. In order to bring read time back to original settings, consolidation, such as sector reading and re-programming with full program time, can be scheduled when the device is in an idle state. The allocation of two or more addresses per sector uses an appropriate logical-to-physical (L2P) table and software in the FTL component.

II. Notations

Notation #1; word-line cells and data vectors: The data vector which has elements that are the levels of each cell at the relevant index is denoted with $\underline{D}$. The physical cells vector that marks the levels of each cell after k program pulses when programming $\underline{D}$ is denoted with $\underline{C}_k$. The number of cells in a word-line is denoted with $W_z$.

Notation #2; ISPP parameters: The incremental-step programming pulse (ISPP) parameters are represented as a three tuple ($V_{INIT}$, $\Delta V$, $V_{REF}$). $V_{INIT}$ is the initial program pulse magnitude. $\Delta V$ is the incremental voltage that is added to previous pulse magnitude. $V_{REF}$ is the target voltage threshold value for each level. As a result, the voltage pulse value after p+1 pulses is:

$$V(p) = V_{INIT} + p \cdot \Delta V \quad \text{(Eqn.1)}$$

There exist ISPP programming schemes which include multiple phases, where each is reset with a program pulse count having different $V_{INIT}$ and $\Delta V$ parameters.

Notation #3; Program Operation: Write process executes several voltage pulses. In L-levels per cell, the pulse operation is a function:

$$\lambda : \{0, 1, \ldots, L-1\}^{W_z} \times \{0, 1, \ldots, L-1\}^{W_z} \rightarrow \{0, 1, \ldots, L-1\}^{W_z} \quad \text{(Eqn.2)}$$

The function receives two inputs: A cells vector with the physical cells' levels and a data vector of the target levels to each cell. The function represents the pulse operation that adds charge to cells with $c_i < d_i$, and reach $d_i$ with some probability that depends on both $c_i$ and $d_i$ and ISPP and device characteristics. Specifically:

$$\lambda(\underline{C}_k, \underline{D}) = \underline{C}_{k+1} \quad \text{(Eqn. 3)}$$

Notation #4; Write Pulse Bandwidth: The vector number of cells in a word-line is denoted with $W_z$. In a single layer cell (SLC), it is equal to the sum of $$P(\underline{C}_k, \underline{D}) = \underline{u} \quad \text{(Eqn. 4)}$$

Where the element $\underline{u}_i$ (index i in vector $\underline{u}$) is the Kronecker delta operation on the subtraction between $(\underline{C}_k)_i$ and $D_i$:

$$u_i = \delta[C_{ki} - D_i] = \begin{cases} 1 & \text{if } C_{k_i} = D_i \\ 0 & \text{else} \end{cases} \quad \text{(Eqn. 5)}$$

The write bandwidth of pulse number k is the number of cells that reached their target level in that pulse:

$$BW(k) = \|P(\underline{C}_k, \underline{D})\|_1 - \|P(\underline{C}_{k-1}, \underline{D})\|_1 \quad \text{(Eqn. 6)}$$

where the norm-1 distance, or Manhattan distance, for vector $\underline{V}$ of dimension N is defined as:

$$\|\underline{V}\|_1 = \sum_{i=1}^{N} |v_i| \quad \text{(Eqn. 7)}$$

Notation #5; Program Bandwidth Regions: The function BW(k) has at least one local maximum point. A numeric threshold (Th) value is denoted, which may be used to distinguish between high and low bandwidth regions where BW(k)≥Th and BW(k)<Th, respectively.

III. High-Bandwidth Programming

The sustained program algorithm includes real-time analysis of per-pulse write bandwidth. An explicit example of flow is described in Algorithm 1, below. In step (1), the data is loaded and programming begins. In step (2) the number of cells that remained to be addressed in future pulses is counted. This measure indicates the bandwidth region. Step (3) compares whether the number of cells successfully programmed per pulse, or, alternatively, the total number of cells unsuccessfully programmed, is lower than a predefined threshold value (low bandwidth). In this case, the remaining data vector is compressed (step 4) and then concatenated with metadata (for the varying compressed vector length) and/or additional page data to program (step 5). Then, the concatenated vector is programmed in another word-line (step 6) and processing returns to the beginning of the loop until the data stream ends.

Algorithm 1: High-Bandwidth Pulse Programming (0) Receive as input: $D_1$, $D_2$, which represent vectors of the current and next page data bits, respectively, and a threshold, which may be based on the percentage of slow cells (e.g., 10%)
(1) For each program pulse while programming $D_1$
(2) C←count the number of remaining cells to program
(3) If C<Threshold
(4) $C_{comp}$←compress vector of remaining data
(5) NextD←{$C_{comp}$, $D_2$} #concatenation
(6) Program NextD on another word-line and return to (1)
(7) End
(8) End The exemplary algorithm does not rely on a priori knowledge of the slow cells. Those are detected in parallel with the write operation and may be skipped, according to a predefined or computed threshold which can be tuned based on the percentage of slow cells, for example, and/or based on the number of pulses, for example.

The flash memory device types and characteristics may impact the expected gain of write acceleration. For example, in floating-gate based devices, programming may include multiple phases, where each phase may have different ISPP parameters such as to compensate for coupling. The write flow may be tuned for simultaneous programming completion of word-line cells by programming first to intermediate levels.

In charge-trapping devices, a single pulse sequence may be used where the charge is added incrementally to all target cells. Therefore, whereas in floating gate technology the slow cells can be on any level (randomly distributed), in charge-trapping the probability of a cell to be slow written is proportional to its target level. This observation may enable further enhancements based on slow cells analyses for particular programming algorithms and NVM devices.

IV. Analysis

In non-adaptive settings without benefit of the exemplary slow-cell-adaptive algorithm, the page size data Pz would be programmed in a series of pulses, each with bandwidth BW(k). Therefore, the non-adaptive bandwidth is:

$$BW = \frac{\sum_{i=1}^{k} BW(i)}{k} = \frac{P_z}{k} \quad \text{(Eqn. 8)}$$

In the exemplary slow-cell-adaptive scheme, programming is stopped after $k_s$ pulses. The resulting data that was written has to be normalized, since the new page size consists of un-coded and compressed parts (that sums up to more than Pz):

$$BW = \frac{\sum_{i=1}^{k_s} BW(i)}{k_s} \cdot \frac{P_z}{P_z + P_z \cdot H\left(\frac{\sum_{i=k_s+1}^{k} BW(i)}{2P_z}\right)} \quad \text{(Eqn. 9)}$$

$$= \frac{\sum_{i=1}^{k_s} BW(i)}{k_s} \cdot \frac{1}{1 + H\left(\frac{P_z - \sum_{i=1}^{k_s} BW(i)}{2P_z}\right)} \quad \text{(Eqn. 10)}$$

Where H(p) is the binary entropy function:

$$H(p) = \Sigma_i p_i \log p_i \quad \text{(Eqn. 11)}$$

Figure 6:
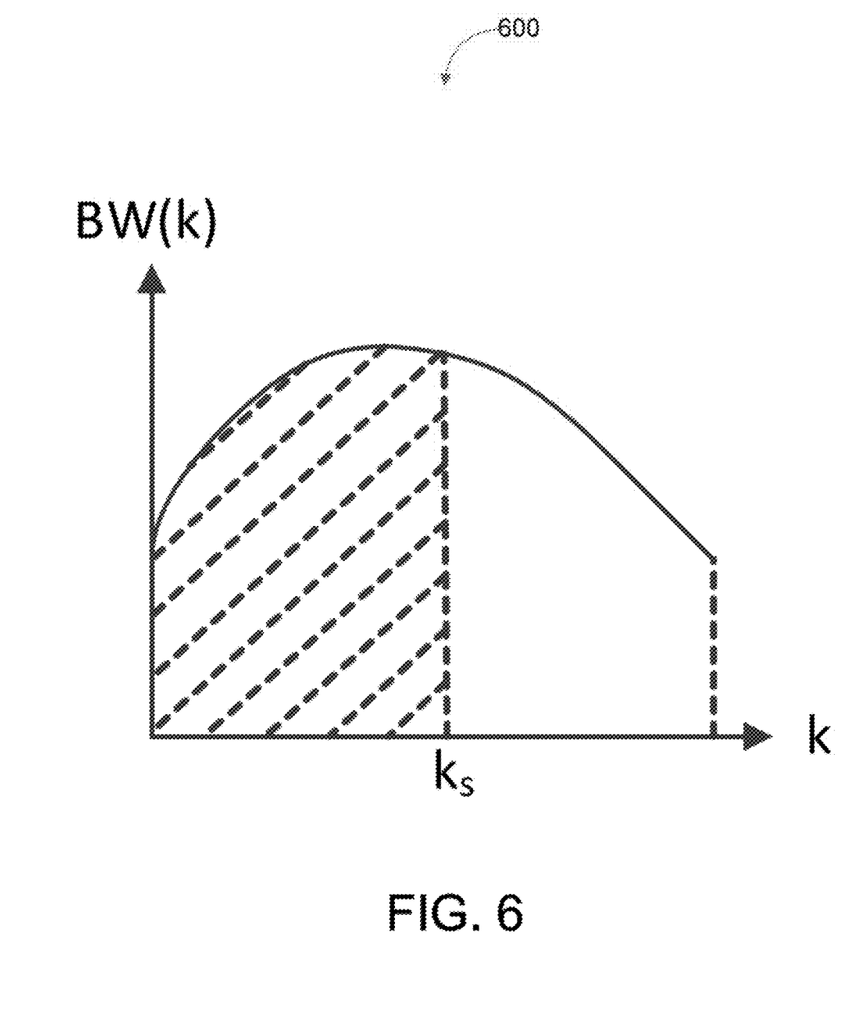
FIG. 6 is a graphical diagram of write speed acceleration in the exemplary method of FIG. 2 in accordance with an exemplary embodiment of the present disclosure.

Turning now to FIG. 6, the achieved bandwidth for $k_s$ pulses is indicated generally by the reference numeral 600. This demonstrates the acceleration of write speed due to determination of $k_s$ pulses in high bandwidth areas. The ratio of programmed data to number of pulses, which is illustrated as the dashed area divided by $k_s$, is higher than for the non-adaptive program, which may be visualized as all graph area divided by k.

Further normalization is used due to increased effective page size or compression overhead. The compression is performed over the 0's indexes of the original page. For example, if the regular write rate is 10 MB/Sec, $$BW = \frac{P_z}{k} = 10 \text{ MB/Sec} \quad \text{(Eqn. 12)}$$

For ease of explanation, assume a case where the new scheme writes 99% of the cells after $k_s$=0.8 k pulses. However, the data to be effectively programmed increases from Pz to Pz·H(0.99). The new accelerated write speed is thus:

$$BW = \frac{\sum_{i=1}^{k_s} BW(i)}{k_s} \cdot \frac{1}{1 + H\left(\frac{\sum_{i=k_s+1}^{k_s} BW(i)}{2P_z}\right)} \quad \text{(Eqn. 13)}$$

$$= \frac{0.99 P_z}{0.8k} \cdot \frac{1}{1 + H(0.005)}$$

$$= 1.18 \frac{P_z}{k} = 11.8 \text{ MB/Sec}$$

The selection of $k_s$ among the number of write pulses is the one that maximizes the bandwidth:

$$k_s = \operatorname{argmax}_{k_s} \left\{ \frac{\sum_{i=1}^{k_s} BW(i)}{k_s} \cdot \frac{1}{1 + H\left(\frac{\sum_{i=k_s+1}^{k} BW(i)}{2P_z}\right)} \right\} \quad \text{(Eqn. 14)}$$

The scheme gain grows as the variation between cells' program speeds is greater. Hence, as the number of pulses per slow cell increases, the write bandwidth bottleneck is eased by the exemplary slow-cell-adaptive compression scheme.

V. Results

Common parameters were used to estimate the gain of the scheme. The gain is influenced by two parameters; namely the number of pulses in which programming stopped ($k_s$), and the number of data bits that were written until that point.

$k_s$ is modeled as a multiplication of the fraction of the total pulses for non-adaptive full-word-line programs:

$$k_s = x \cdot k, \quad 0 < x < 1 \qquad \text{(Eqn. 15)}$$

The considered x values were 0.5 to 0.9 (hence 50% to 90% of the full number of non-adaptive pulses). The number of bits written until it reached $k_s$ pulses is:

$$\sum_{i=1}^{k_s} BW(i) \qquad \text{(Eqn. 16)}$$

The considered values were 95% to 99.9% of total data.

Figure 7:
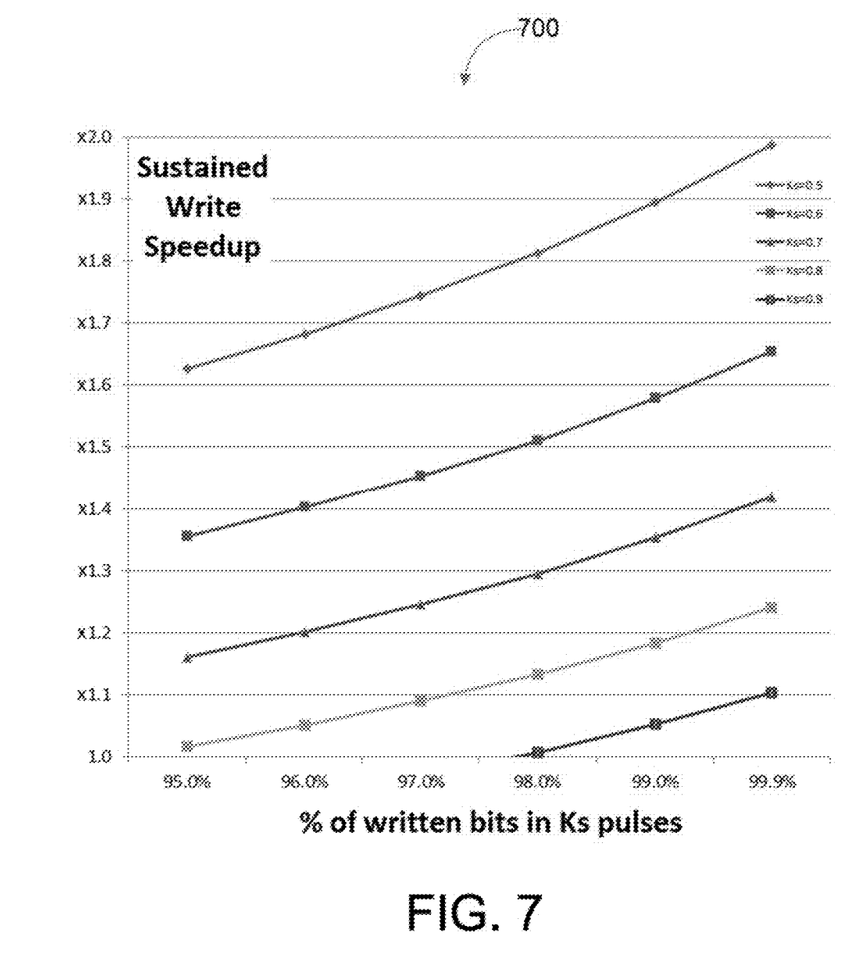
FIG. 7 is a graphical diagram of comparative write speed accelerations in the method of FIG. 2 in accordance with an exemplary embodiment of the present disclosure.

As shown in FIG. 7, the results are indicated generally by the reference numeral 700. This provides an overview of sustained write speedup versus the number of written bits in a given $k_s$ pulses. Since the value $k_s$ was modeled as a fraction of the total number of pulses taken for non-adaptive programming, referred as k; therefore $k_s = x \cdot k$.

Here, a linear increase is evident in sustained program speedup according to the increase in percentage of number of written cells for a given $k_s$ pulses. The gain ranges between a multiple of times 1.05 at $k_s = 0.8 \cdot k$ and 95% programmed bits, to a multiple of times 2 at $k_s = 0.5 \cdot k$ and 99.9% programmed bits. This results in the write bandwidth equation with $k_s$ ranging from 0.5 to 0.9 (50% to 90% of full non-adaptive program pulses) and corresponding 95 to 99.9 percentage of written cells in $k_s$ pulses, while the acceleration ranges between ×1.05 to ×2 depending on scheme parameters as shown.

Figure 8:
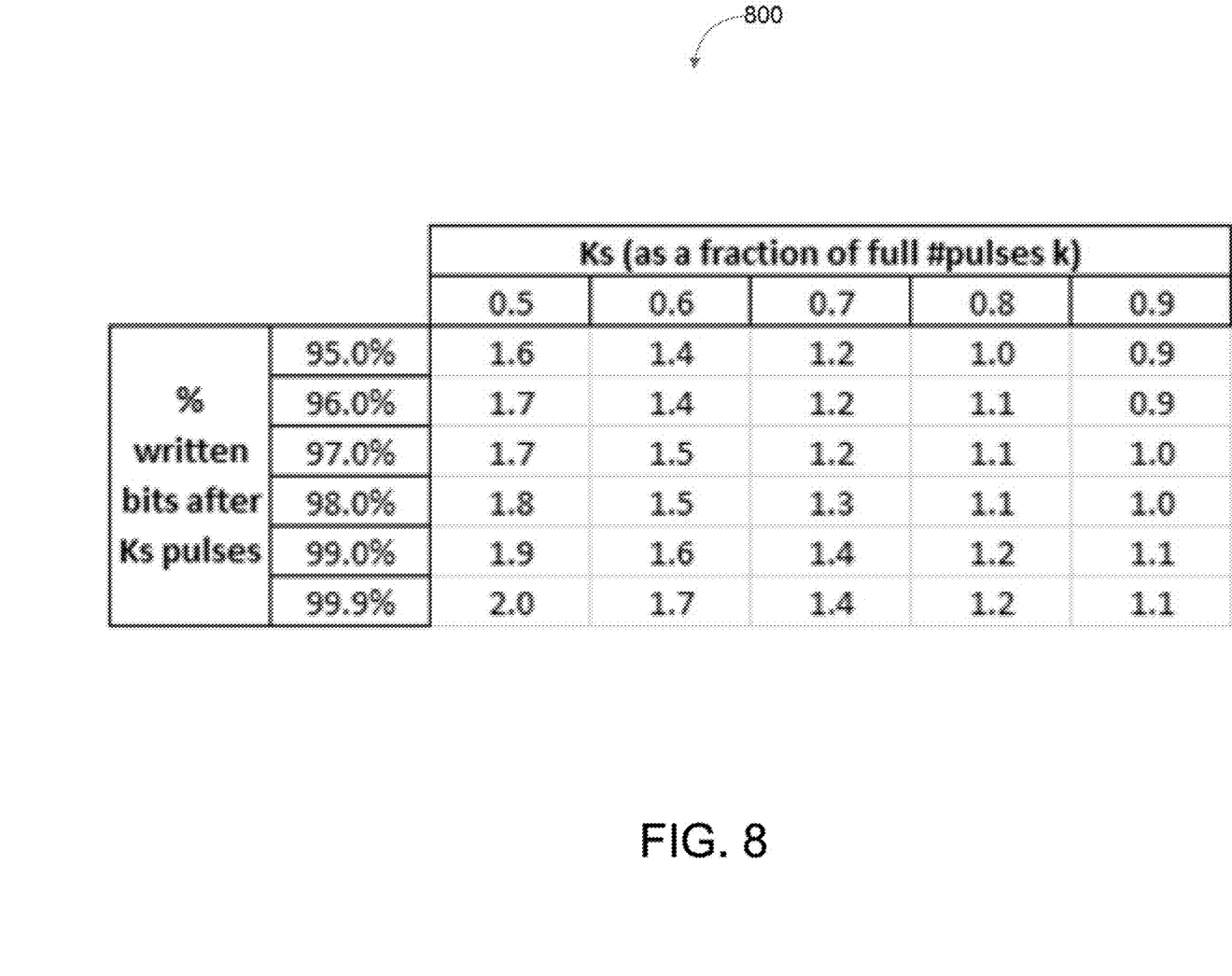
FIG. 8 is a tabular diagram of comparative write speed accelerations in the method of FIG. 2 in accordance with an exemplary embodiment of the present disclosure.

Turning to FIG. 8, tabular results are indicated generally by the reference numeral 800. That is, FIG. 8 tabulates particular data values shown graphically in FIG. 7.

VI. Implementation

The presented scheme can be integrated with or without NAND modifications, depending on the target performance and design complexity. In order to restore read performance, program consolidation may be executed in idle time where split word-lines are read and joined for full write operation, and correspondingly normal subsequent read operation.

Without NAND Modifications

A summary of this approach is shown in Algorithm 2. The controller sends the data to be programmed to the NAND, but keep a copy of it (step 1). The ISPP process programs the data until $k_s$, reads the data that it was able to store, and transmits it back to the controller (step 2). Finally, the controller compresses the received residual data, concatenates it with another page, update the FTL with the split addresses per page, and continues the program on the next word-line (step 3).

Algorithm 2: Sustained Write without NAND changes
(1) Controller sends page to NAND and keeps a copy
(2) NAND is programming the data in $k_s$ pulses and send back the verify data to controller
(3) The controller compresses the received vector, concatenate with another page, update FTL and program elsewhere With NAND Modifications The steps for this scheme are listed in Algorithm 3. If on-chip modifications are allowed, the comparison between verify and original data and the compression of the difference vector is performed on the flash memory die without transmitting verify data to the controller (steps 1 to 4). Next, the compressed vector is attached to the next or a subsequent incoming data and programmed with it to the next or a subsequent word-line or plane (step 5).

Algorithm 3: Sustained Write with NAND Changes
(1) Controller sends page to NAND
(2) NAND is programming the data in $k_s$ pulses
(3) Perform read verify of the page
(4) $C_{comp} \leftarrow$ compress vector of difference between verify and original data (on-chip compression)
(5) concatenate NextD $\leftarrow \{C_{comp}, D_2\}$ with next controller data over next word-line or another plane VII. Remarks Non-volatile memory with high sustained write throughput is desirable for data-intensive applications, such as high-definition (HD) video recording. A non-preferred approach for increasing I/O operation is by parallelism with multiple components. However, the system cost increases accordingly, and such solutions are not feasible for small or mobile usage applications such as wearable computational devices or sensor modules. A non-preferred approach of using error-correction codes (ECC) may also try to expedite writes, but the number of slow cells that cause programming bottlenecks are typically higher than 1% which may correspond to high bit error rates and impractical ECC overhead and complexity.

In the present disclosure, an exemplary preferred algorithm for increasing the sustained write throughput of a single NVM flash component is provided. A method according to at least one embodiment performs programming pulses only while a high number of cells are successfully programmed in each pulse. When the write bandwidth slows down, the algorithm compresses the remaining data vector, concatenates it with the next page data, and continues the program operations with the next word-line. As a result, program pulses are applied only at the high bandwidth regions and speedup is achieved.

While the scheme accelerates sustained write speeds, the read speeds of the data that was programmed in split word-lines may be slowed due to multiple sensing operations from different word-lines to decode the compressed and/or concatenated data. Therefore, consolidation of read and reconstruction of sector data, such as with full programming in idle time, may be used to restore read performance. Analysis results show up to double speed improvements in single-die program throughout, depending on ISPP parameters and device variations.

As memory devices include increasingly larger numbers of cells in each silicon die, it may be correspondingly harder to manufacture and control the process; thus, the variation between cells is unlikely to significantly decrease. The method of the present disclosure is scalable, since it dynamically exploits the programming characteristics of the NVM word-line without a priori knowledge of which cells may be slow, such as due to transient environmental factors. The presently disclosed scheme releases the bottleneck that is caused by slow cells and may enhance sustained system write performance.

Although exemplary embodiments of the present inventive concept have been shown and described, it shall be understood that those of ordinary skill in the pertinent art may make changes therein without departing from the scope, principles and spirit of the present inventive concept as defined by the appended claims and their equivalents.

What is claimed is:

1. A method of memory programming comprising:
receiving a first write data unit including a plurality of data bits;

programming by at least one pulse the plurality of data bits to a plurality of memory cells;

determining if a number of cells successfully programmed by the at least one pulse is less than a threshold; and if the number of cells successfully programmed by the at least one pulse is less than the threshold, compressing a sparse vector of unsuccessfully programmed data bits, receiving another write data unit, concatenating the vector based on the other write data unit, and programming the concatenated vector to another plurality of memory cells.

2. A method as defined in claim 1 wherein concatenating the sparse vector comprises concatenating the compressed sparse vector with the other write data unit.

3. A method as defined in claim 1 wherein concatenating the sparse vector comprises concatenating the sparse vector with another sparse vector of unsuccessfully programmed data bits of the other write data unit.

4. A method as defined in claim 3 wherein the sparse vector and the other sparse vector are each compressed prior to concatenation.

5. A method as defined in claim 1 wherein the threshold is based on a number of cells successfully programmed in a previous pulse.

6. A method as defined in claim 1 wherein the threshold is based on a number of cells successfully programmed after a same number of pulses in a previous program cycle.

7. A method as defined in claim 1 wherein the threshold is based on a number of cells successfully programmed after a given number of pulses at a present clock speed per manufacturer specifications.

8. A method as defined in claim 1 wherein the threshold is based on a maximum write latency for a currently running application.

9. A method as defined in claim 1, further comprising a memory controller compressing the sparse vector, concatenating the compressed vector with the other write data unit, and updating a flash translation layer (FTL).

10. A method as defined in claim 1, further comprising a page buffer compressing the sparse vector, and concatenating the compressed vector with the other write data unit.

11. A method as defined in claim 1 wherein each write data unit is at least one of a byte, a word, a page, or a sector.

12. A method as defined in claim 1 wherein the first plurality of memory cells and the other plurality of memory cells are on different separately addressable layers of a same three-dimensional (3D) memory die.

13. A method as defined in claim 1, further comprising:
reading the successfully programmed data bits from the first plurality of memory cells;
reading the compressed vector from the other plurality of memory cells;
decompressing the vector; and
reconstructing the first data unit from the read data bits and the decompressed vector.

14. A method as defined in claim 1, further comprising:
selecting an address line connected to the plurality of memory cells;
wherein the address line is a word-line.

15. A memory device comprising:
a memory cell array;
a data circuit configured to receive a first write data unit including a first plurality of data bits;
a row decoder connected to the memory cell array and configured to select a first word-line connected to a first plurality of memory cells of the memory cell array;
a page buffer connected to the data circuit and to the memory cell array and configured to program by at least one pulse the first plurality of data bits to the first plurality of memory cells;
a counter configured to determine if a number of cells successfully programmed by the at least one pulse is less than a threshold;
a slow-cell data compressor connected to the counter and configured to compress, if the number of cells successfully programmed by the at least one pulse is less than the threshold, a first sparse vector of unsuccessfully programmed data bits; and
a control circuit connected to the slow-cell data compressor and to the page buffer, and configured to concatenate, if the number of cells successfully programmed by the at least one pulse is less than the threshold, the first sparse vector based on a second write data unit, and to write the concatenated vector to a second plurality of memory cells of the memory cell array connected to a second word-line different from the first word-line,
wherein the page buffer is configured to read the compressed vector from the second plurality of memory cells, and to decompress the vector.

16. A memory device as defined in claim 15 wherein the slow-cell data compressor and the counter are comprised by the control circuit.

17. A memory device as defined in claim 15 wherein at least one of the slow-cell data compressor or the control circuit is comprised by the page buffer.

18. A memory device as defined in claim 15, wherein:
the page buffer is configured to read the successfully programmed data bits from the first plurality of memory cells, and to reconstruct the first data unit from the read data bits and the decompressed vector.

19. A memory device as defined in claim 18, wherein the page buffer is further configured to write by a full pulse program the reconstructed first data unit including the first plurality of data bits to the first plurality of memory cells.

20. A program storage device tangibly embodying a non-transitory program of instructions executable by a processor to implement steps of memory programming, the steps comprising:
receiving a first write data unit including a plurality of data bits;
selecting a first address line connected to a plurality of memory cells;
programming by at least one pulse the plurality of data bits to the plurality of memory cells;
determining if a number of cells successfully programmed by the at least one pulse is less than a threshold; and
if the number of cells successfully programmed by the at least one pulse is less than the threshold, compressing a sparse vector of unsuccessfully programmed data bits, receiving another write data unit, concatenating the vector based on the other write data unit, selecting a second address line connected to another plurality of memory cells, and programming the concatenated vector to the other plurality of memory cells,
wherein the first and second address lines are disposed on different levels of a three-dimensional memory.

* * * * *